United States Patent
Mimura et al.

(12) 
(10) Patent No.: US 6,182,403 B1
(45) Date of Patent: Feb. 6, 2001

(54) COMBINATION SOLAR BATTERY AND ROOF UNIT AND MOUNTING METHOD THEREOF

(75) Inventors: Toshihiko Mimura; Kimitoshi Fukae; Akiharu Takabayashi, all of Nara; Masahiro Mori, Kyoto; Takeshi Takada, Kyotanabe, all of (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 08/917,297

(22) Filed: Aug. 25, 1997

(30) Foreign Application Priority Data

Aug. 30, 1996 (JP) .................................................. 8-246906

(51) Int. Cl.⁷ .................................................. E04D 13/18
(52) U.S. Cl. .......................... 52/173.3; 52/468; 126/621; 126/623; 136/244; 136/291
(58) Field of Search ................. 52/173.3, 461, 52/468, 469; 136/244, 251, 291; 126/621, 622, 623

(56) References Cited

U.S. PATENT DOCUMENTS

| | | |
|---|---|---|
| 4,189,881 | 2/1980 | Hawley . |
| 5,092,939 | 3/1992 | Nath . |
| 5,232,518 * | 8/1993 | Nath et al. . |
| 5,589,006 | 12/1996 | Itoyama . |
| 5,679,176 | 10/1997 | Tsuzuki . |

FOREIGN PATENT DOCUMENTS

| | | |
|---|---|---|
| 59-152670 | 8/1984 | (JP) . |
| 05055618 | 3/1993 | (JP) . |
| 07211932 | 8/1995 | (JP) . |
| 07302924 | 11/1995 | (JP) . |
| 93/14525 | 7/1993 | (WO) . |

OTHER PUBLICATIONS

Patent Abstracts of Japan, vol. 095, No. 011, Dec. 26, 1995 (corresponds to JP 07–211932).

* cited by examiner

*Primary Examiner*—Christopher T. Kent
(74) *Attorney, Agent, or Firm*—Fitzpatrick, Cella, Harper & Scinto

(57) ABSTRACT

A roof unit is constructed in such an arrangement that a plurality of combination solar battery and roof panels, each having flanges at two opposite sides, are placed adjacent to each other with clearance on a joining/fixing member, the adjacent combination solar battery and roof panels are fixed to the joining/fixing member in the clearance by a removable fixture, and a removable cap is placed in an upper part of the clearance. This arrangement simplifies the work at a work site, decreases the construction cost, and decreases work errors. In addition, measurement or replacement of each module can be made even after mounting, thus providing a practical vertical-roofing roof excellent in maintainability and also in wind endurance.

37 Claims, 12 Drawing Sheets

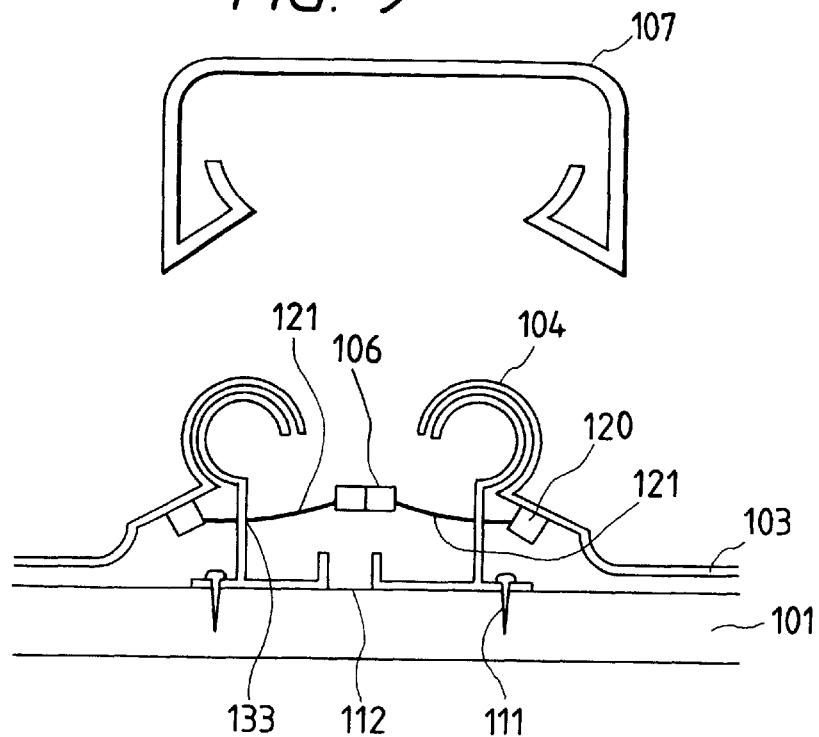
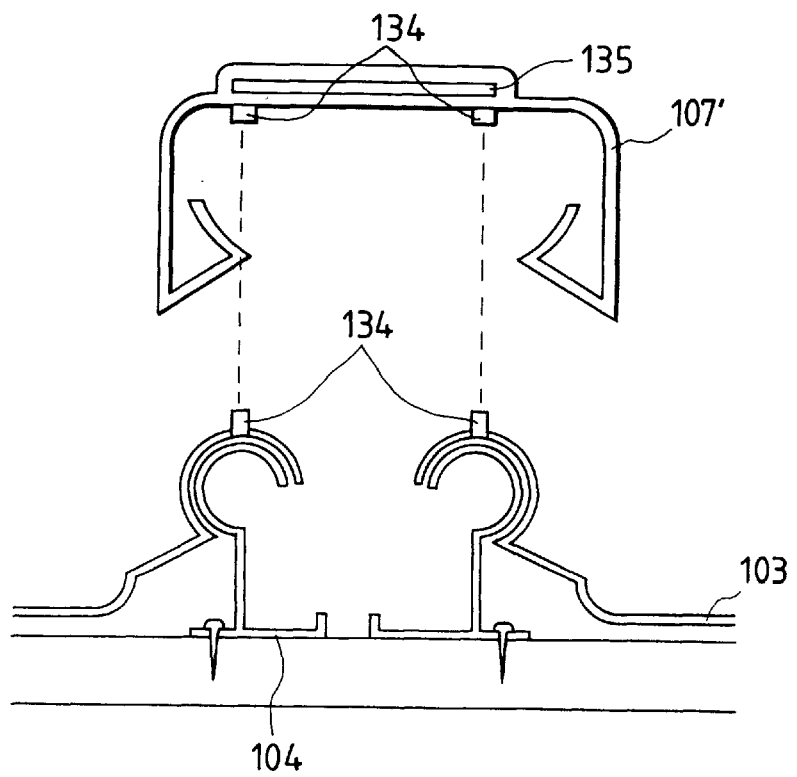

COMBINATION SOLAR BATTERY AND ROOF UNIT AND MOUNTING METHOD THEREOF

BACKGROUND OF THE INVENTION

1. Field of the Invention

The present invention relates to a roof for general house using combination solar battery and roof members and to a mounting method thereof. More particularly, the present invention relates to a roof constructed by mounting roof panels in the vertical direction, for example, like a roof of the batten seam structure (a vertical-roofing roof) and to a mounting method thereof and presents proposals on a vertical-roofing roof to solve specific problems arising in the combination structure of solar battery and roof panel and on a mounting method thereof.

2. Related Background Art

There are mainly two ways for placing a solar battery on a roof: one of them is a method for mounting the solar battery on an existing roof; the other is a method for laying the solar battery itself as a roof.

In the former, the solar battery is installed by use of some frame on the existing roof, and conventional solar battery modules can thus be used as they are. However, the installation cost is high and the appearance is poor. Therefore, the latter method is drawing attention recently.

As for the latter method, a variety of mounting methods of roof are known for long in general. The conventional mounting methods are classified roughly into flat roofing, standing seam roofing, batten seam roofing, corrugated sheet roofing, folded sheet roofing, horizontal roofing, tile roofing, weld roofing, and so on. Among these, the folded sheet roofing and corrugated sheet roofing are normally used for factories and warehouses, and most of mounting methods for general house are tile roofing (including plain tile roofing), batten seam roofing, horizontal roofing, and modifications thereof.

Prior art examples of such methods using the solar battery for general house include Japanese Patent Application Laid-open No. 5-55618 (tile roofing), Japanese Patent Application Laid-open No. 59-152670 (horizontal roofing), Japanese Patent Application Laid-open No. 7-302924 (horizontal roofing), Japanese Patent Application Laid-open No. 7-211932 (batten seam roofing), U.S. Pat. No. 5,092,939 (batten seam roofing), and U.S. Pat. No. 4,189,881 (vertical roofing).

FIG. 13 and FIG. 14 show the batten seam roof structure described in Japanese Patent Application Laid-open No. 7-211932, which is called batten seam roofing with batten, because a batten is interposed between roof panels. The roofing method is carried out as follows.

(1) Rafters not illustrated are mounted on purlins not illustrated.

(2) Sheathing roof boards 101 are placed on and/or between the rafters and are fixed to the rafters by nails or the like.

(3) Underlayment 102 is laid over the sheathing roof boards.

(4) Spacers S are fixed onto the underlayment 102 with nails N.

(5) Battens M are fixed onto the spacers S with nails N.

(6) Then combination solar battery and roof panels 103, processed by folding, are placed on steps of the battens M and spacers S and the wiring work is carried out with connection connectors 106 on the back surface side.

(7) After completion of wiring, caps 107 are put over the battens M so as to pinch the head of each batten M and the upright portions of the folded portions of the roof panels on the both sides thereof.

(8) Then the combination solar battery and roof panels 103, together with the caps 107, are fixed to the battens M by use of tacks R as shown in FIG. 14.

The foregoing is the batten seam roofing method with batten.

FIG. 15 shows another typical roof structure of batten seam roofing, as also described in U.S. Pat. No. 4,189,881, which is called batten seam roofing without batten, because the battens are excluded from the above-stated batten seam roofing.

(1) The rafters not illustrated are mounted on the purlins not illustrated.

(2) The sheathing roof boards 101 are placed on (between) the rafters.

(3) The underlayment not illustrated is laid over the sheathing roof boards 101.

(4) Roof panels 103 with the respective solar batteries mounted thereon are fixed by use of through retaining clips 104 in such a way that while each retaining clip catches the upright portions of the roof panels, it is fixed to the sheathing roof board with nails N.

(5) Wires C guided from the back surfaces of the roof panels are set in spaces in the through retaining clips 104.

(6) Caps 107 are put over the through retaining clips 104 to be fixed.

The foregoing is the batten seam roofing without batten.

The mounting methods of roof materials as described above, however, require the wiring work in addition to the laying work of roof materials conventionally conducted, which complicates the mounting work and which thus poses a problem of increase in the construction cost. In the case of the mounting as described in Japanese Patent Application Laid-open No. 7-211932, there is no way for measuring the output of each solar battery. If some of solar batteries became faulty, it would not be easy to find out the faulty batteries. Even if they were found out, replacement of individual solar batteries would involve great difficulties, thus posing a problem in maintenance.

In contrast with it, in the batten seam roofing without batten as illustrated in U.S. Pat. No. 4,189,881, the wiring can be put between the retaining clip and the cover and even after completion of mounting, the wiring part can be exposed by removing the cover. It thus has a merit of easy maintenance. However, the roof mounting construction also involves the wire connection work and the mounting is also complicated. Especially, since the work on the roof costs high, simplification of work has been demanded in order to realize the reduction of cost.

U.S. Pat. No. 5,092,939 discloses a roof structure in which individual roof panels 103 are fixed on roof frame members H shown in present FIGS. 16 and 17. Wiring parts C are laid below the roof panels 103. Such wiring complicates the mounting process and impedes maintenance. Unlike the present invention, the roof structure of U.S. Pat. No. 5,092,939 exhibits poor wind endurance.

The present invention presents a further progress in the above-stated ideas in view of these problems and thus provides a practical vertical-roofing roof and a mounting method thereof to simplify the work at a working site, that are low in the construction cost, that can reduce work errors, that permit measurement or replacement of each module unit after mounted, and that are excellent in maintainability and in wind endurance.

SUMMARY OF THE INVENTION

For achieving the above object, the present invention employed the following means.

(1) A plurality of combination solar battery and roof panels are fixed onto a fixing member by fixtures with clearance between the plurality of combination solar battery and roof panels.

(2) A roof structural member is used as the fixing member.

(3) Output terminals of solar batteries of the combination solar battery and roof panels are connected with each other in the clearance.

The following functional effects can be expected by the above means according to the present invention.

(1) By employing the arrangement of assembly unit, the installation work and the electric wiring work, which was conventionally conducted at the working site, can be carried out in the factory, which can greatly decrease the expensive mounting work at the working site. Despite the assembly structure, the individual combination solar battery and roof panels can be removed easily even after mounted, by removing the fixtures to the stationary members, which thus enhances maintainability.

The problem of poor wind endurance arising with such mounting and with enlargement of roof member is also solved by the assembly unit according to the present invention, because the assembly unit can be fixed to the roof structural member in the clearance between the combination solar battery and roof panels. Therefore, the wind endurance can be maintained at the same level as before.

(2) By the arrangement wherein the assembly unit is integrally coupled with the roof structural member, no new members are necessary in the building for forming the roof, and thus the roof can be constructed at low cost.

(3) By the arrangement wherein the wiring members are collected in the clearance between the vertical-roofing roof panels, maintainability after mounting is enhanced. In addition, since electric wires are preliminarily connected in the factory, no electric connection member is necessary between the combination solar battery and roof panels, which can decrease the number of wiring members.

BRIEF DESCRIPTION OF THE DRAWINGS

FIG. 9 is a cross-sectional view of a connecting part of FIG. 8;

FIG. 11 is a cross-sectional view of a connecting part of FIG. 10;

DESCRIPTION OF THE PREFERRED EMBODIMENTS

Embodiment 1

Figure 1:
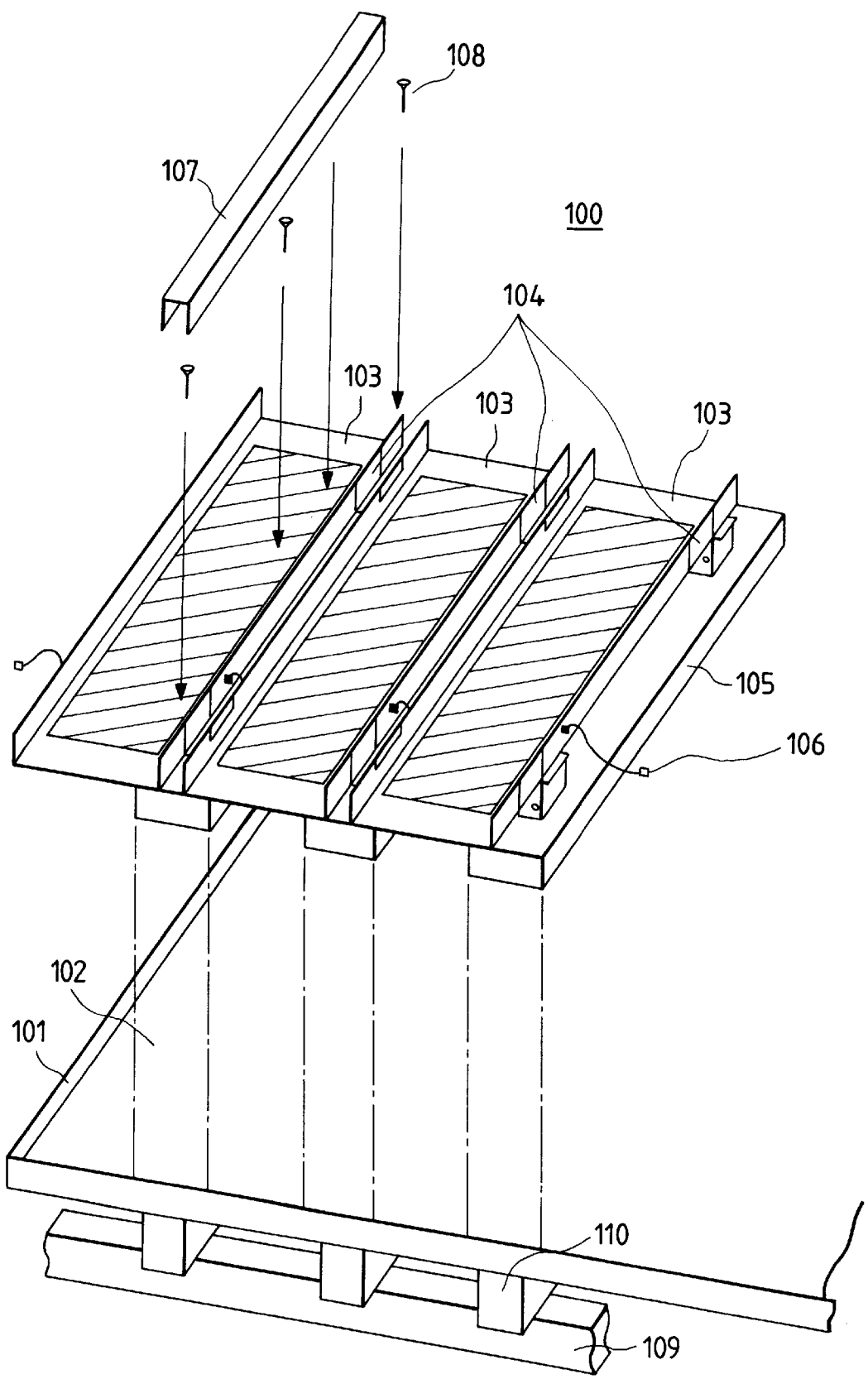
FIG. 1 is an explanatory drawing to illustrate the mounting in the first embodiment of the present invention.

A fabrication method of combination solar battery and roof unit of the present embodiment will be described referring to FIG. 1 and FIG. 2.

First, two or more combination solar battery and roof panels 103 are fixed onto joining/fixing members 105 with retaining clips 104 and screws 111 in the factory. At this time clearance is provided above the joining/fixing members. Each retaining clip 104 is provided with hole 112 in which drill screw 108 for securing the unit 100 to the roof is inserted.

Next, connectors 106 of lead wires 121 led out of respective junction boxes 120 are connected between adjacent roof panels 103. For this, the junction boxes 120 are attached to flanges 130 of roof panels 103, but not on the back side of the roof panels.

At the final step, caps 107 are mounted, and the caps 107 and horizontal beams (not illustrated) removable in the normal direction are fixed, thus completing the unit 100. The horizontal beams are for preventing the unit 100 from being deformed during carriage and mounting.

Mounting Method

Next, the mounting method of the unit 100 will be described referring to FIG. 1.

The units 100 are carried all together to the working site on a truck or the like and are mounted in the following procedures.

(1) The rafters 110 are attached to the purlins 109 of house.

(2) The sheathing roof boards 101 are installed on (between) the rafters 110.

(3) The underlayment 102 is laid over the sheathing roof boards 101.

(4) The first unit 100 is temporarily placed near the edge of roof on the underlayment, using a lifting device such as a crane.

(5) The caps 107 of the unit 100 thus mounted are removed and long drill screws 108 or the like are screwed from the top of the joining/fixing members 105 into the rafters 110 below the sheathing roof boards 101.

(6) After the unit 100 is fixed, the caps 107 are again put and fixed there.

(7) For interconnection between units 100, another unit 100 to be coupled is fixed in the same procedure as in (5) while adjusting the clearance by the retaining clips 104 for use in interconnection between units 100.

(8) After fixation, the coupling part is fixed by the retaining clips 104 and wiring is made at the coupling part.

(9) The coupling part is fixed to the rafter 110 below the sheathing roof board 101 in the same procedure as in (5) from the top of the coupling part.

(10) The cap 107 is put and fixed onto the coupling part.

(11) The procedures of (7) to (10) are repeated, thereby successively mounting the vertical-roofing roof.

(12) After the mounting, the horizontal beams are removed, thus completing the mounting of the vertical-roofing roof.

For connection between units 100, an output portion of each unit 100 has a connection connector 106, as before, and the wiring work can be conducted without any Jig by interconnecting the connectors 106 on the roof.

Since the present embodiment can greatly decrease the work at the working site, the construction cost can be reduced remarkably. After the roof is constructed, the roof panels can be replaced one by one in the same manner as in the conventional roof constructed of single roof panels. As for replacement of roof panel due to failure of solar battery, the entire roof does not have to be removed, different from the conventional assembly panel (U.S. Pat. No. 5,092,939).

Further, since the units 100 are directly fixed onto the roof structural members from the top of the joining/fixing members 105 of unit 100, the problem of poor wind endurance, which has been the problem in the conventional assembly panels, does not arise, because the strength comparable to that of the conventional roofs is achieved. Therefore, the present embodiment realizes highly practical roof mounting.

In addition, by the arrangement wherein the wire members are collected in the clearance between adjacent roof panels 103, maintainability after mounting is enhanced. Since the electric wires are preliminarily wired in the factory, no electric connection member is necessary between roof panels 103, which decreases the number of wiring members, thus achieving an extra effect to realize low cost.

The vertical-roofing combination solar battery and roof unit according to the present embodiment was described as to the mounting method thereof, based on the premise that the roof is one of a house constructed by the framework construction method, but the present invention is not limited to the framework construction method. It is needless to mention that the present invention can also be applied, for example, to houses constructed by the two-by-four construction method, prefabricated houses using light-weight steel frames, buildings using reinforced concrete, and so on.

The present invention is ready for the maintenance specific to the solar battery. The present invention also has the effect of preventing errors upon mounting, which could occur because of the complicated wiring work, and the effect of reducing the material cost because of the decrease in the number of wiring members.

Application to Air Circulation System

Figure 12:
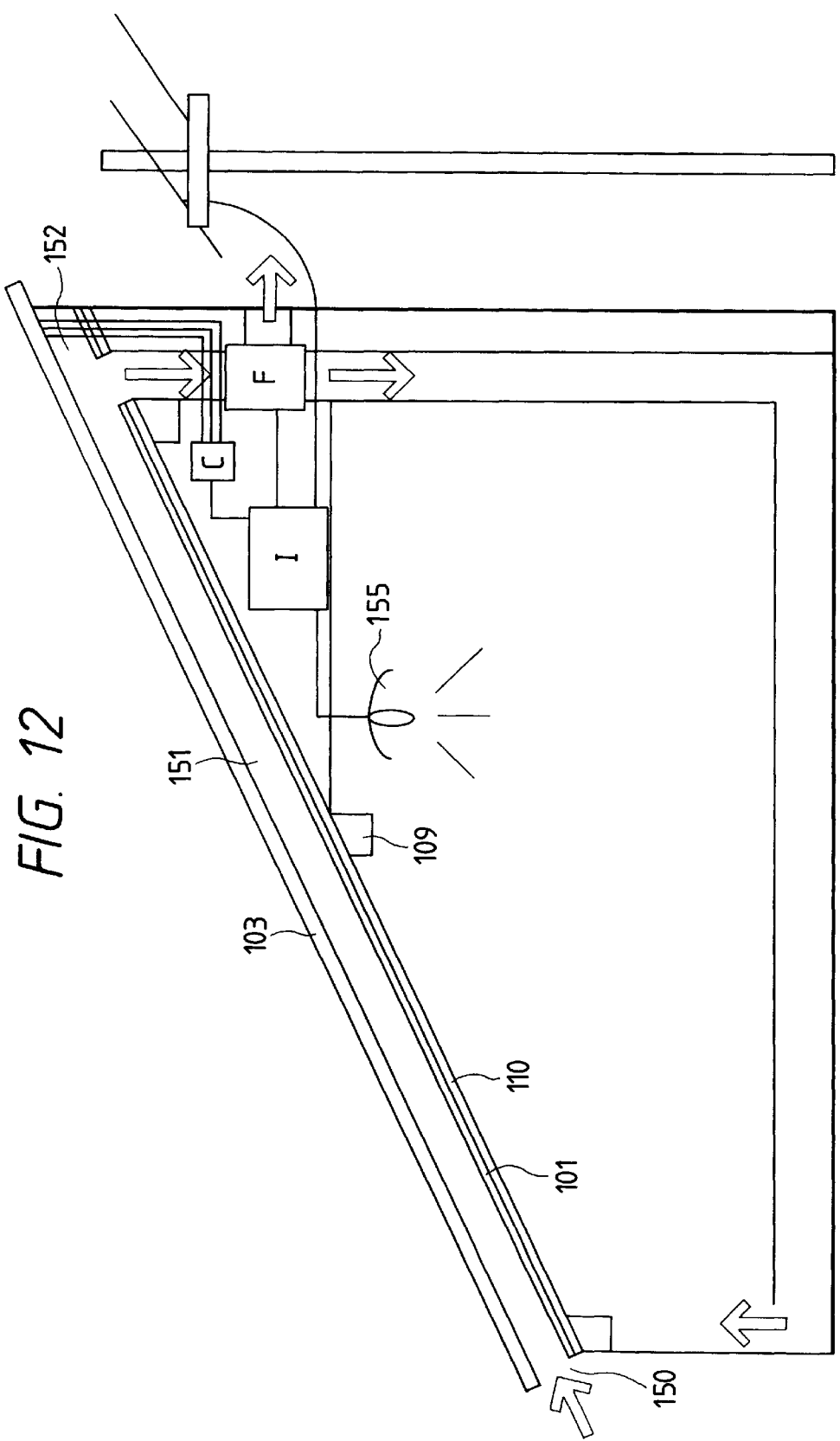
FIG. 12 is a drawing to show an air circulating system of the present invention.
Figure 13:
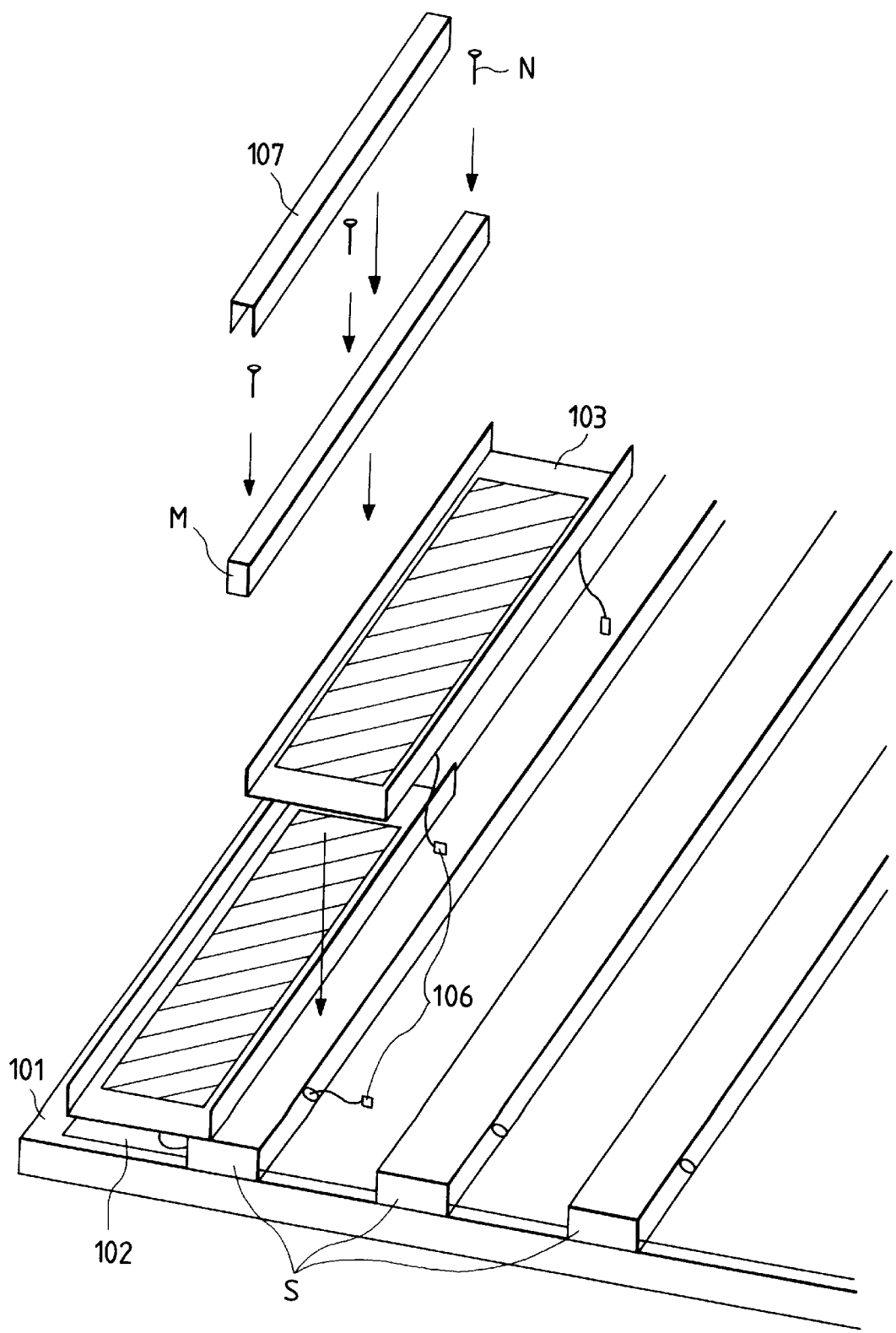
FIG. 13 is an explanatory drawing to show the mounting of the batten seam roof with batten in the conventional example.
Figure 14:
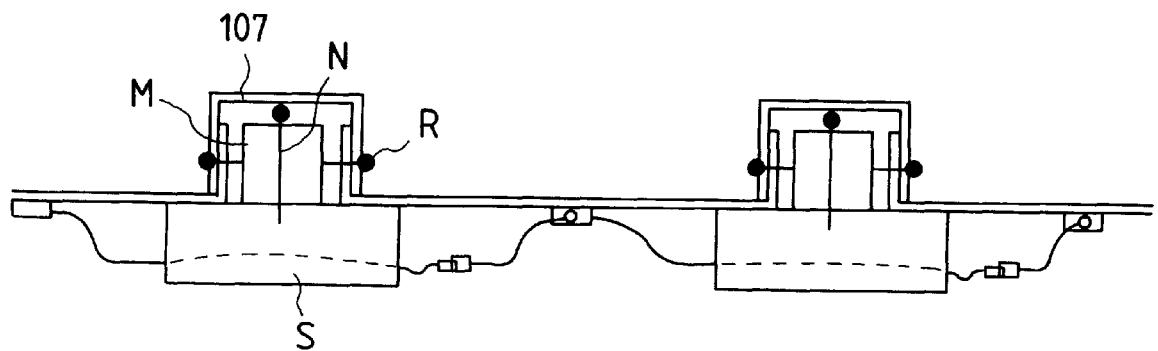
FIG. 14 is a cross-sectional view of a connecting part of FIG. 13.
Figure 15:
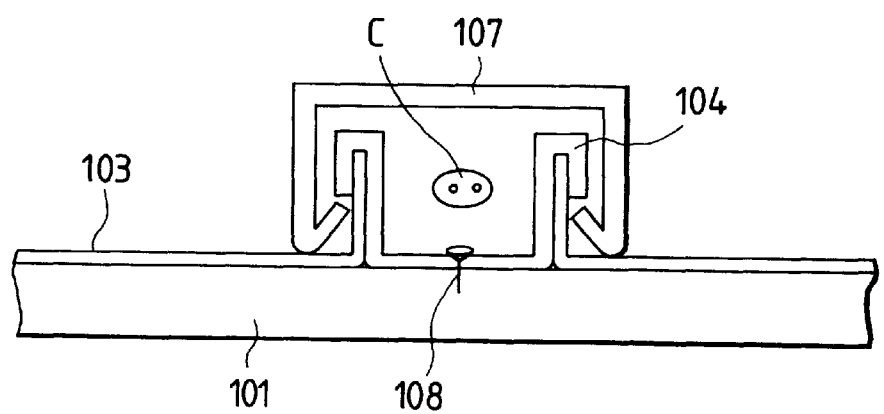
FIG. 15 is an explanatory drawing to show the mounting of the batten seam roof without batten in the conventional example.
Figure 16:
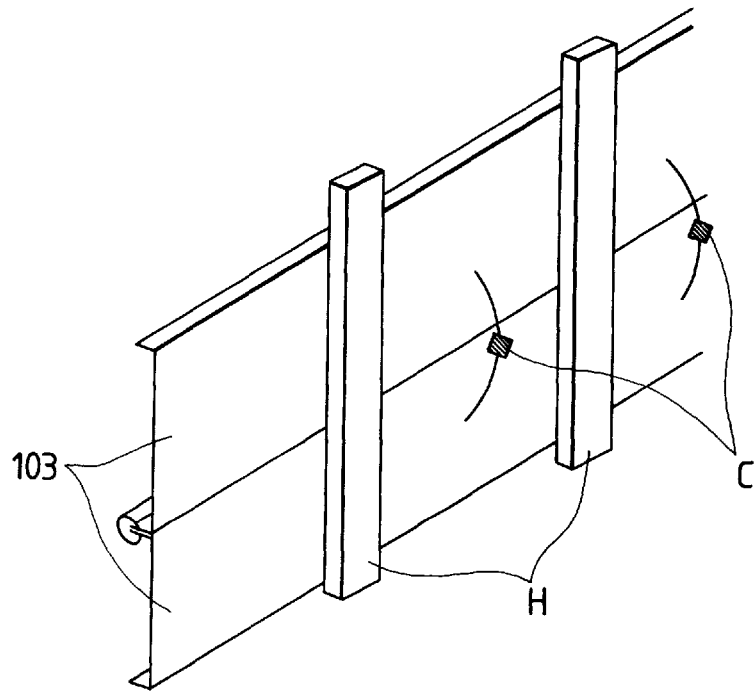
FIG. 16 is an explanatory drawing of the combination solar battery and roof assembly unit in the conventional example.
Figure 17:
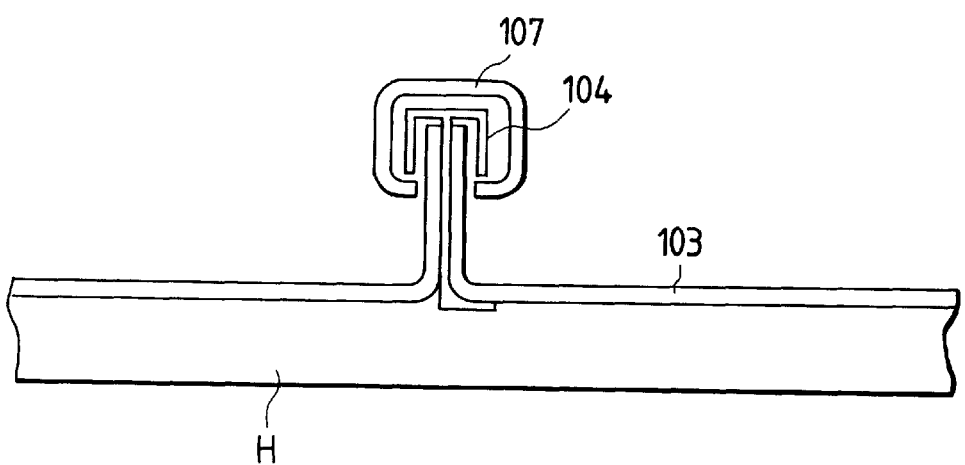
FIG. 17 is a drawing to show a connecting part of FIG. 16.

Since the present invention can be realized in the structure having a draft layer capable of introducing the air to between the sheathing roof boards 101 and the roof panels 103, it can be applied to an air circulation system of house as shown in FIG. 12. In FIG. 12, arrows indicate the flow of air. In the cold season, the air taken through the eaves 150 flows through the draft layer 151 to be heated by thermal conduction from the roof panels 103 of roof unit 100 and the heated air is taken into room 153 via the ridge 152 to be used for heating. A heat accumulating device may be provided below the floor. For forcing the air to circulate, a fan F is provided midway of the air flow passage. In the hot season the air taken through the eaves 150 is discharged from exhaust port 154 to the outside to enhance the heat insulating function of roof, thereby keeping the environment in the room 153 comfortable.

Power generated in the roof units 100 is supplied through DC combiner box C to inverter I. A solar electric power generation system is constructed in this way. The power converted by the inverter I is supplied to the fan F or to the other loads 155 in the home.

In the present embodiment the clearance exists between the roof panels 103 and the sheathing roof boards 101, and horizontal beams thinner than the clearance space may thus be provided in the clearance. Since the horizontal beams can prevent deformation of unit 100, the removable beams employed in the present embodiment thus become unnecessary. Therefore, the work on the roof can be decreased further. It is also needless to mention that the removable beams are not necessary as long as the fixing members alone can assure the strength enough to resist deformation upon carriage and mounting.

Example of Electric Wiring

Figure 5:
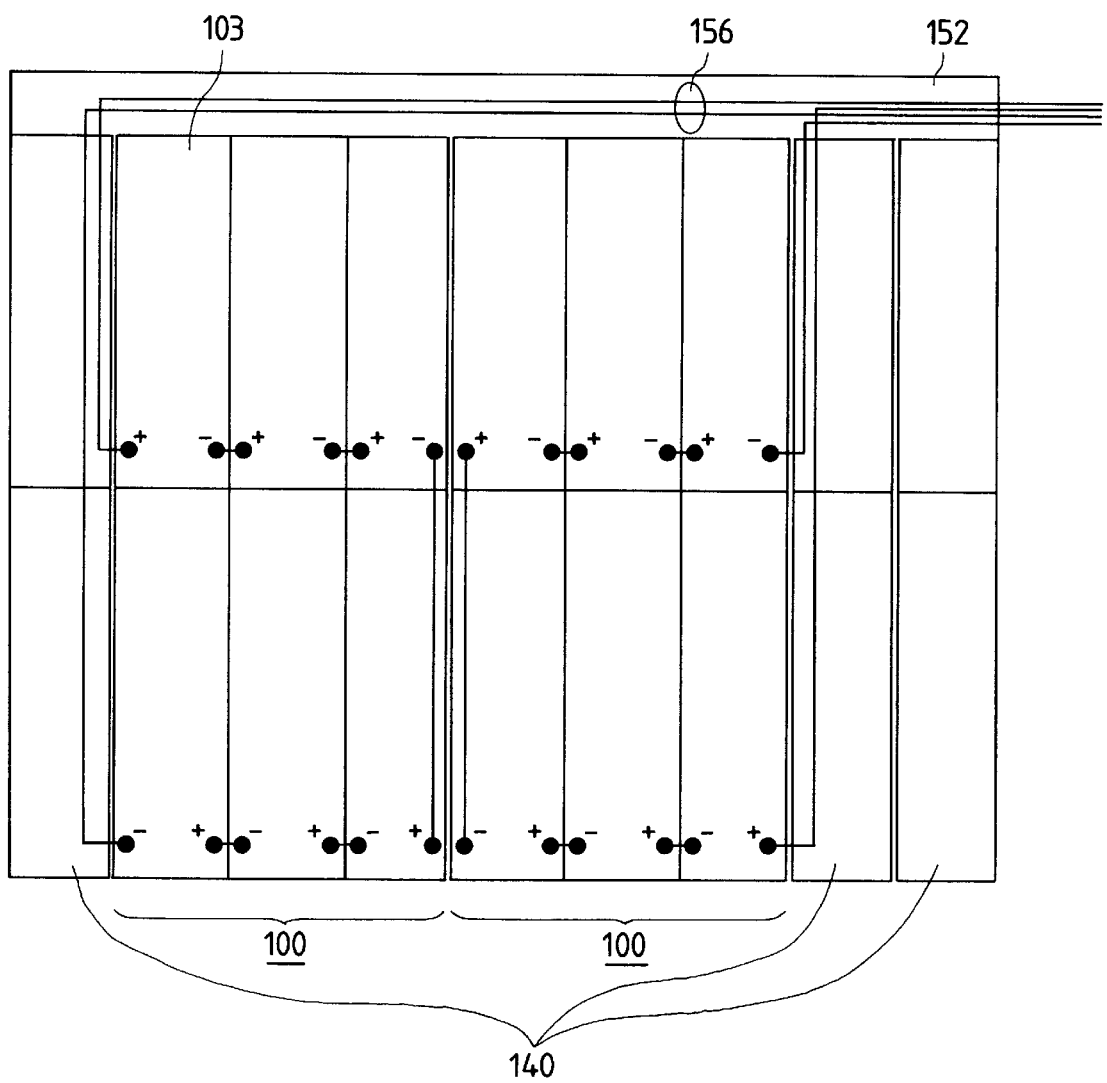
FIG. 5 is a wiring diagram of solar batteries where the first embodiment is mounted on the roof.

FIG. 5 shows an example of electric wiring in the case of use of the roof units of the present invention. A unit 100 is comprised of a solar battery string in which a plurality of combination solar battery and roof panels 103 are connected in series, and one solar battery string is set to just an input voltage of the inverter (for example, 200 V). There are a plurality of units 100 or solar battery strings provided and an output cable of each unit is guided independently of the other via the ridge 152 of roof to the DC combiner box. In FIG. 12 the DC combiner box is indicated by C. The plurality of output cables are arranged to be connected in parallel in the DC combiner box C and to be coupled to the inverter. A breaker is provided before the connection point of the parallel connection of each solar battery string. If a certain solar battery string becomes faulty, the solar battery string will be electrically disconnected and maintenance can be made. In practice the junction boxes are located on the flanges of roof panel 103. If the junction boxes are arranged in symmetry with respect to a vertical line, serial or parallel connection can be selected freely depending upon the arrangement of roof panels, which is useful. Reference numeral 140 denotes the conventional roof panels, called dummy panels, and the dummy panels are mounted in incomplete portions, which cannot be divided by the dimensions of roof and the dimensions of unit, whereby the appearance and the flashing process of edge can be achieved.

Description of Each Member

The members constructing each unit and the members related to that mounting of the unit will be described. These are also applicable in common to the other embodiments described below. It is, however, noted that the joining/fixing members 105 are unnecessary when the roof structural member is used as the fixing members.

1. Combination Solar Battery and Roof Panel 103

Figure 4:
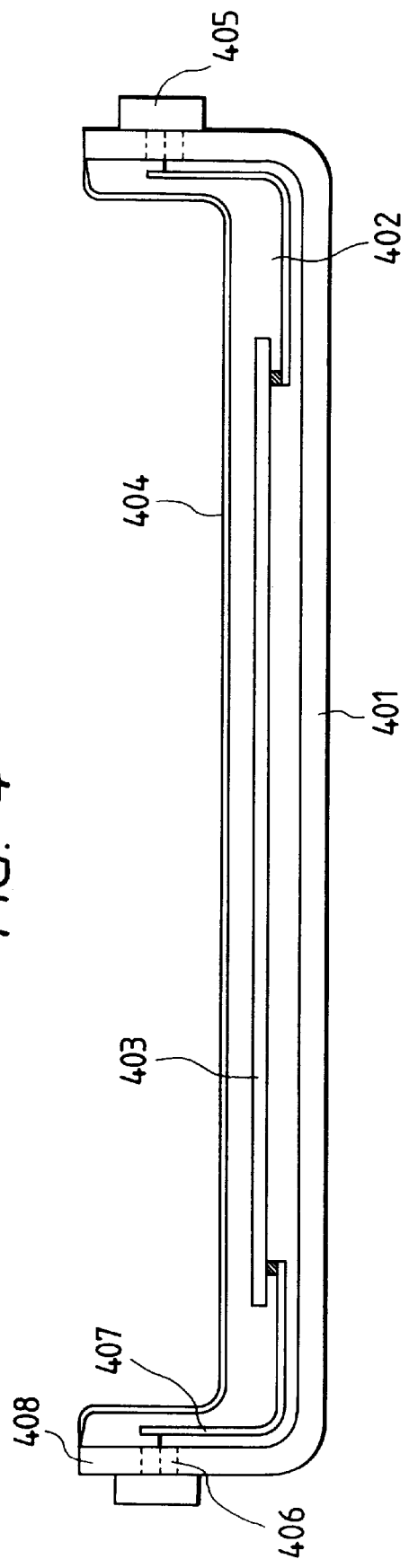
FIG. 4 is a cross-sectional view of a combination solar battery and roof panel used in the first embodiment.

The combination solar battery and roof panel 103 is composed of at least backing 401, filling material 402, solar battery element 403, surface film 404, and junction boxes 405, as shown in FIG. 4.

Backing 401

The material for the backing 401 can be selected from steel sheets with sufficient strength and nonferrous metals with excellent corrosion resistance, similar to the conventional metal roofs, and also from plastics and ceramics.

Examples of the steel sheets include surface-treated steel sheets, coated steel sheets, alloys or special steels containing another element, and composite steel sheets laminated with a heat-insulating material or the like. In general, the material is selected from hot-dip galvanized steel sheets, galphan, galvalium steel sheets, hot-dip aluminized steel sheets, copper-plated steel sheets, polyvinyl chloride precoated steel plates, fluorocarbon resin steel sheets, stainless steel sheets, high damping steel sheets, heat-insulating galvanized sheet iron, atmosphere corrosion resisting steel, and the aforementioned coated steel sheets; or from the nonferrous metals, such as copper sheets, aluminum alloy sheets, zinc alloy sheets, lead sheets, titanium sheets, and the aforementioned coated color sheets. In the case of plastics, suitable members are those with excellent structural strength such as FRP and those in combination with metal framework. The metal sheets are especially suitable in respect of processability.

Solar Battery Element 403

There are no specific limitations on the type of the solar battery element 403 used in the present invention, and it may be of any form, either single crystal, polycrystal, fine crystal, or amorphous. The solar battery element may be either of an Si based material or of a compound based material. Among others, the amorphous solar battery element is preferable because of possession of flexibility. Since the amorphous solar battery element recovers its degradation by heat, it is suitable for use on the roof.

Figure 3:
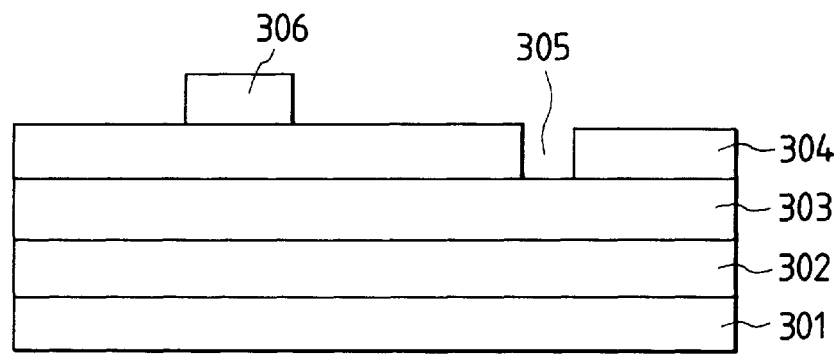
FIG. 3 is a cross-sectional view of a solar battery element used in the first embodiment.

FIG. 3 shows a cross-sectional view of an amorphous silicon solar battery which is a flexible solar battery element.

Substrate 301 is a member for mechanically supporting semiconductor layer 303 in the case of the thin-film solar battery like amorphous silicon and it is also used as an electrode in some cases. The substrate needs to have such heat resistance as to resist heating temperatures upon film formation of the semiconductor layer 303, but may be electrically conductive or insulative.

Specific examples of the conductive materials include thin plates of metals such as Fe, Ni, Cr, Al, Mo, Au, Nb, Ta, V, Ti, Pt, and Pb; thin plates of alloys thereof, for example, thin plates of brass, stainless steel, or the like; composites thereof; carbon sheets, galvanized steel sheets, and so on.

Specific examples of the electrically insulating materials include films or sheets of heat-resisting synthetic resins such as polyester, polyethylene, polycarbonate, cellulose acetate, polypropylene, polyvinyl chloride, polyvinylidene chloride, polystyrene, polyamide, polyimide, and epoxy; thin plates of composites thereof with glass fiber, carbon fiber, boron fiber, metal fiber, or the like; materials obtained by depositing a metal thin film of different material and/or an insulating thin film of $SiO_2$, $Si_3N_4$, $Al_2O_3$, AlN, or the like on a surface of a thin plate of these metals, a resin sheet, or the like by a surface coating treatment such as a sputtering process, a vapor deposition process, a plating process, or the like; glasses, ceramics, and so on.

Lower electrode (back reflecting layer) 302 is one electrode for extracting power generated in the semiconductor layer 303, which is required to have such a work function as to be an ohmic contact to the semiconductor layer 303. The material for the lower electrode may be selected from the so-called single metals or alloys such as Al, Ag, Pt, Au, Ni, Ti, Mo, W, Fe, V, Cr, Cu, stainless steel, brass, nichrome, $SnO_2$, $In_2O_3$, ZnO, and ITO; transparent conductive oxides (TCO), and so on.

The surface of the lower electrode 302 is preferably smooth, but it may be texturized where irregular reflection of light is expected. It is also called as a back reflecting layer. When the substrate 301 is electrically conductive, the lower electrode 302 does not have to be provided in particular.

A fabrication process of the lower electrode 302 may employ such a method as plating, vapor deposition, or sputtering, which is selected properly as occasion demands.

The material for the semiconductor layer 303 of solar battery element used in the present invention is selected from materials obtained by doping non-monocrystal silicon, silicon germanium, silicon carbon, or the like with hydrogen and/or fluorine.

A film-forming process of the semiconductor layer is selected from the well-known methods such as the vapor deposition process, the sputtering process, the RF plasma enhanced CVD process, the microwave plasma enhanced CVD process, the ECR process, the thermal CVD process, and the LPCVD process as occasion demands. The RF plasma enhanced CVD process for decomposing the stock gas by RF plasma and depositing silicon on the substrate is preferably used as an industrially employed process. The RF plasma enhanced CVD has a problem that the decomposition efficiency of stock gas is low, approximately 10%, and a problem that the deposition rate is slow, approximately from 1 Å/s to 10 Å/s, and the microwave plasma enhanced CVD process is drawing attention as a film-forming method that can solve such problems.

A reactor for carrying out the above film formation can be selected from well-known devices such as batch type devices or continuous film-forming devices as occasion demands. The so-called tandem cell or triple cell including a laminate of two or more semiconductor junctions can be applied to the solar battery of the present invention in order to increase the spectral sensitivity and the voltage.

Upper electrode (transparent conductive film) 304 is an electrode for extracting electromotive force generated in the semiconductor layer 303, which is paired with the aforementioned lower electrode. The upper electrode needs to be transparent, because it is located on the light incidence side, and it is also called as a transparent conductive film.

The upper electrode 304 desirably has the transmittance of light not less than 85% for efficient absorption of light from the sun, a fluorescent lamp, or the like in the semiconductor layer 303, and further, electrically, it desirably has a sheet resistance value not more than 100 $\Omega/\square$ for making electric current generated by light flow horizontally relative to the semiconductor layer 303. Examples of materials having such characteristics include metal oxides such as $SnO_2$, $In_2O_3$, ZnO, CdO, $CdSnO_4$, and ITO ($In_2O_3+SnO_2$).

A fabrication process of the upper electrode 304 is properly selected from the resistance heating vapor deposition process, the electron beam heating vapor deposition process, the sputtering process, the spray process, and so on as occasion demands.

For determining an active area of electric power generation of the above solar battery element, an etching line of 305 can be formed by removing a part of the above transparent conductive film 304 by a desired method selected from the conventionally known etching techniques, for example, such as chemical etching, printing etching, and electrochemical etching.

After that, collector electrode 306 is formed on the transparent conductive film by patterning a metal or a conductive paste by a method of sputtering, vapor deposition, printing, or bonding. In addition, output lead 407 of a material such as copper foil is attached to the back face. A plurality of solar battery elements may be connected in series.

The amorphous solar battery itself, fabricated in this way, has high flexibility and it is a flexible solar battery having the characteristics suitable for the present invention.

Filling Material 402

Preferred examples of the filling material 402 are EVA (ethylene-vinyl acetate), EEA (ethylene-ethylacrylate), PVB (polyvinyl butyral), and so on in terms of the adhesive property with the solar battery element, weatherability, and buffer effect. For enhancing mechanical characteristics, it is used in some cases together with a filler such as nonwoven glass fabric or silica.

Surface Film 404

For enhancing the moisture proofness and scratch-resistant property, fluorine based resins are preferably applied for the surface film 404 in respect of weatherability. Examples of the fluorine based resins include polymers of tetrafluoroethylene, TFE (TEFLON or the like available from duPont), copolymers of tetrafluoroethylene with ethylene, ETFE (TEFZEL or the like available from duPont), polyfluorovinyl (TEDLAR or the like available from duPont), polychlorofluoroethylene, CTFE (Neoflon available from Daikin Kogyo), and so on. An ultraviolet absorber well known may be added to these resins so as to improve the weatherability. A more preferred film is a film the surface of which is roughened by a method of corona discharge treatment or the like, in order to improve the adhesive property with the bonding layer. Further, a non-oriented film is more preferable so as to be ready for various types of bending.

Sealing Method

The sealing method includes stacking the backing, the filling material, the solar battery element, the filling material, and the surface film and then pressing the stack in a vacuum under heat and pressure by a vacuum laminator. After sealing, edges of the backing are bent into the shape of the roof panel. An opening is preliminarily formed in each terminal outlet 406 of the backing. Folding can be conducted using a bender, a roller former, or the like.

Junction Box 405

The junction box 405 is a box for housing the terminal for drawing the power out. The roof panel 103 is provided with the openings 406. After the flange 408 is formed by folding of the roof panel, the junction boxes 405 are attached so as to cover the openings. A junction box is composed, for example, of a box member having an opening top surface, and a lid member closing the top surface. The terminal in the junction box 405 is connected with output lead 407 by a conductor. Further, a cable for drawing the power to the outside is connected to the terminal in the junction box.

By locating the junction boxes 405 in the flange 408 of the backing, the roof unit of the present invention can be constructed easily. Specifically, in comparison with the case wherein the junction boxes are located on the back surface side, electric connection between the roof panels 103 can be made easily in the clearance between adjacent portions in fabricating the roof unit 100. Further, when the roof panel is removed for maintenance or the like after installation of the roof unit 100, the electric connection with the adjacent roof panel can be disconnected easily.

Preferred materials for the junction box are plastics and, in consideration of flame retardancy, materials such as flame-retardant plastics and ceramics are preferable. Examples of the plastics include engineering plastics excellent in the strength, impact resistance, heat resistance, hardness, and aging property such as Noryl, polycarbonate, polyamide, polyacetal, modified PPO, polyester, polyarylate, unsaturated polyester, phenolic resin, and epoxy resin. In addition, thermoplastic resins such as ABS resin, PP, and PVC can also be applied.

In order to prevent electric leakage from occurring in case of accidental water leakage, the inside of the junction box 405 is filled with a filler in the present invention. There are no specific limitations on the filler, but preferred kinds of materials for the filler include epoxy resin based adhesives, silicone based potting agents, and silicone based adhesive sealing agents with good electric insulation. The silicone based resins are more preferable in consideration of flexibility or the like. In consideration of workability in addition, preferred materials are those of one-part type with short curing time and those with low viscosity easy to fill even fine parts. In the case of use of silicone one-part type RTV rubber, the curing method is preferably of the deacetonization type or of the dealcoholization type in order to avoid erosion of electrode.

Examples of the epoxy resin based adhesives available from Three Bond Co., Ltd. are trade names "2001," "2002H," "2003," "2016B," and "2022," and the above epoxy resins can be used as mixed at a desired ratio with a curing agent selected from trade names "2102B," "2103," "2104," "2105F," "2105C," "2106," "2131B," "2131D," "2131F," and "2163."

2. Combination Solar Battery and Roof Unit 100

The unit 100 is composed of at least combination solar battery and roof panels 103, retaining clips 104 as fixtures for coupling them, joining/fixing members 105 as fixing members, nails 108 for securing the joining/fixing members 105 to the rafters 110, and caps 107.

Fixture 104

The retaining clips 104 as fixtures are metal fittings for securing the roof panels 103 to the joining/fixing members 105 and a variety of shapes are conventionally known for the retaining clips, according to the shapes of roof panel. Since the fixtures are members for substantially supporting the wind endurance, they are thicker than the roof panels and steel members with high mechanical strength are usually used. The fixtures also have the function to interconnect the roof panels and those used in a through form are called, especially, as through retaining clips.

Cap 107

Figure 2:
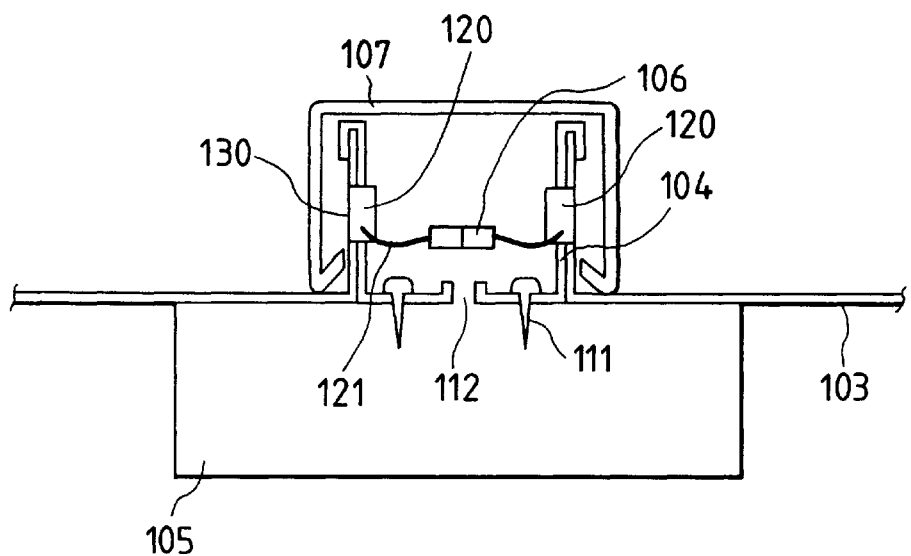
FIG. 2 is a cross-sectional view of a connecting part of FIG. 1.

The cap 107 is used for the flashing structure and for the appearance, as shown in FIG. 1, in the clearance between the side edge of roof panel 103 and a roof panel adjacent thereto. The cap 107 can be made of a material of the same type as the roof panel 103 and of a color in consideration of a balance of design to the roof panel 103. In the present embodiment the wire members are set below this cap and the cap is fixed by removable fasteners (not illustrated) so as to permit maintenance.

Joining/Fixing Member

There are no specific limitations on the material for the joining/fixing members 105, but timber materials are suitable in terms of easiness of processing and mounting.

3. Roof Structural Members

The roof structural members in the present invention are general names of the members for supporting the roof in the building, and in the case of the rafter method often used in the framework construction method, the roof structural members include the purlins, rafters, roof bed members (sheathing roof boards), and underlayment.

In addition, known ways for constructing the roof include the roof beam method, the truss method, the strut building method, and so on and in either method, the roof bed members are always fixed to the rafters.

Purlin 109

The purlins 109 are main structural members for supporting the roof, which are made of a material with sufficiently high mechanical strength, out of the metal materials, timber materials, and so on. The purlins normally mean members that are placed in parallel with the ridge and that support the rafters 110. The roof unit of the present invention may preliminarily incorporate the purlins as well.

Rafter 110

The rafters 110 are structural members that receive the sheathing roof boards 101 as roof bed members and that are fixed to the purlins 109, and there are rafters made of metal and rafters made of timber. The roof unit of the present invention may preliminarily incorporate the rafters as well.

Roof Bed Member (Sheathing Roof Board) 101

The material for roof bed member may be any material that can present the base for fixing the roofing material, and particularly preferable materials are plates having a heat insulating property; specifically, sheathing roof boards of flat wood plate, mortar, cemented excelsior board, plywood, cemented chip, and insulation board.

The roof bed member may have a backing of a heat insulating material of polystyrene foam, polyurethane foam, polyethylene foam, glass wool, rock wool, or the like.

With use of the heat insulating material having the thermal conductivity of not more than 0.2 kcal/m, hr°C., the air is heated between the roof panel 103 and the roof bed member 101; and as a result, in the case of use of the amorphous silicon solar batteries as solar batteries, degradation of performance of the amorphous silicon solar batteries is recovered by the heat. This can improve the performance of the amorphous silicon solar batteries, so that such an arrangement is suitable for the roof bed member.

Underlayment 102

The underlayment 102 complements the waterproof performance of the roof panels and is made of a material having the waterproof function. Further, some underlayments have the heat insulating property and humidity conditioning function to some extent and the material for underlayment is selected from natural materials and artificial materials. Specifically, the former includes bark and wood shingle and the latter includes metal sheets, asphalt, modified asphalt, synthetic rubbers, and synthetic resins. A sheet of a single layer or multiple layers is used for the underlayment. In the aspect of fire resistance, metals are more preferred for the underlayment.

Embodiment 2

Figure 6:
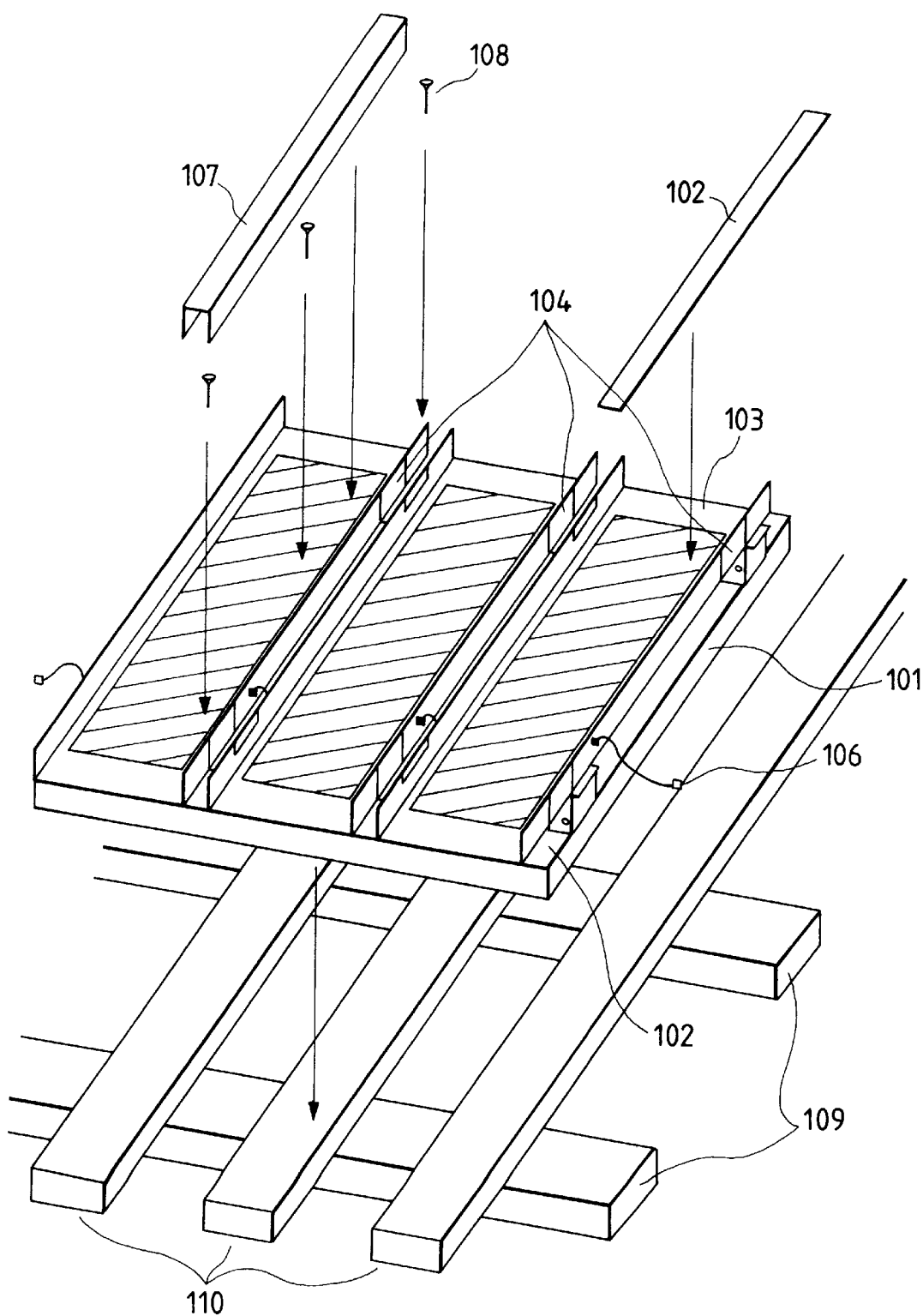
FIG. 6 is an explanatory drawing to illustrate the mounting in the second embodiment of the present invention.
Figure 7:
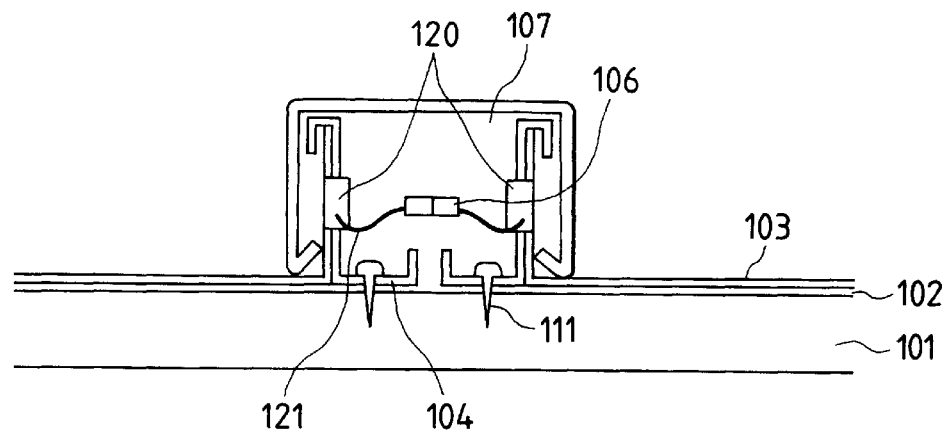
FIG. 7 is a cross-sectional view of a connecting part of FIG. 6.

The fabrication method of the combination solar battery and roof unit of the present embodiment will be described referring to FIG. 6 and FIG. 7. In the present embodiment the sheathing roof board 101 of a flat plate shape is used as the joining/fixing member.

In the factory two or more combination solar battery and roof panels 103 are fixed to the sheathing roof board 101 of a fixed size with underlayment 102 thereon with clearance by use of through retaining clips 104 and screws 111, thus forming an assembly. Next, the connectors 106 of lead wires 121 taken out of the junction boxes 120 are connected in the clearance between adjacent roof panels 103. Finally, the caps 107 are laid thereon, thus completing the unit.

Mounting Method

The units are carried all together on a truck or the like to the working site and are mounted in the following procedures.

(1) The rafters 110 are attached to the purlins 109.

(2) On the rafters 110, the first unit is temporarily placed at the edge of roof by use of the lifting device such as the crane.

(3) The caps 107 of the unit thus mounted are removed and long drill screws 108 or the like are screwed from the top of the sheathing roof board 101 into the rafters 110 to directly secure the unit to the rafters 110.

(4) After fixation of unit, the caps 107 are again put in position and fixed there.

(5) For connection between units, the upright portion of roof panel 103 of the unit to be joined is fixed in the same procedure as in (3) while adjusting the clearance by the through retaining clips 104 used for coupling between units.

(6) After the fixation, the area below the coupling part is again covered by underlayment 102.

(7) The roof panel 103 at the edge of each unit adjacent to the pertinent unit is coupled and fixed by the through retaining clips 104.

(8) The roof panel is fixed to the rafter 110 from above the coupling part in the same procedure as in (3).

(9) The cap 107 is laid over the coupling part and fixed there.

(10) Mounting of the vertical-roofing roof is completed by repeating the procedures of (5) to (9).

In the present embodiment, since the sheathing roof board 101 is also included in the unit, the finish work of roof mounting can be carried out immediately after mounting of rafters 110. This can further decrease the work at the working site and can decrease the construction cost more remarkably.

Although the present embodiment is described in the arrangement that the underlayment 102 preliminarily laid in the unit has the same size as the sheathing roof board 101, the underlayment 102 may be set a little larger than the sheathing roof board 101, which allows the underlayment 102 newly added in the step (6) to be omitted.

Further, if the rafters 102 are also incorporated in the unit and if the joint portions between the purlins 109 and the rafters 110 are located in the clearance, the steps can be decreased further. In further expansion, it is also possible to incorporate the purlins 109 in the unit and to fix the unit to pole plates.

Embodiment 3

Figure 8:
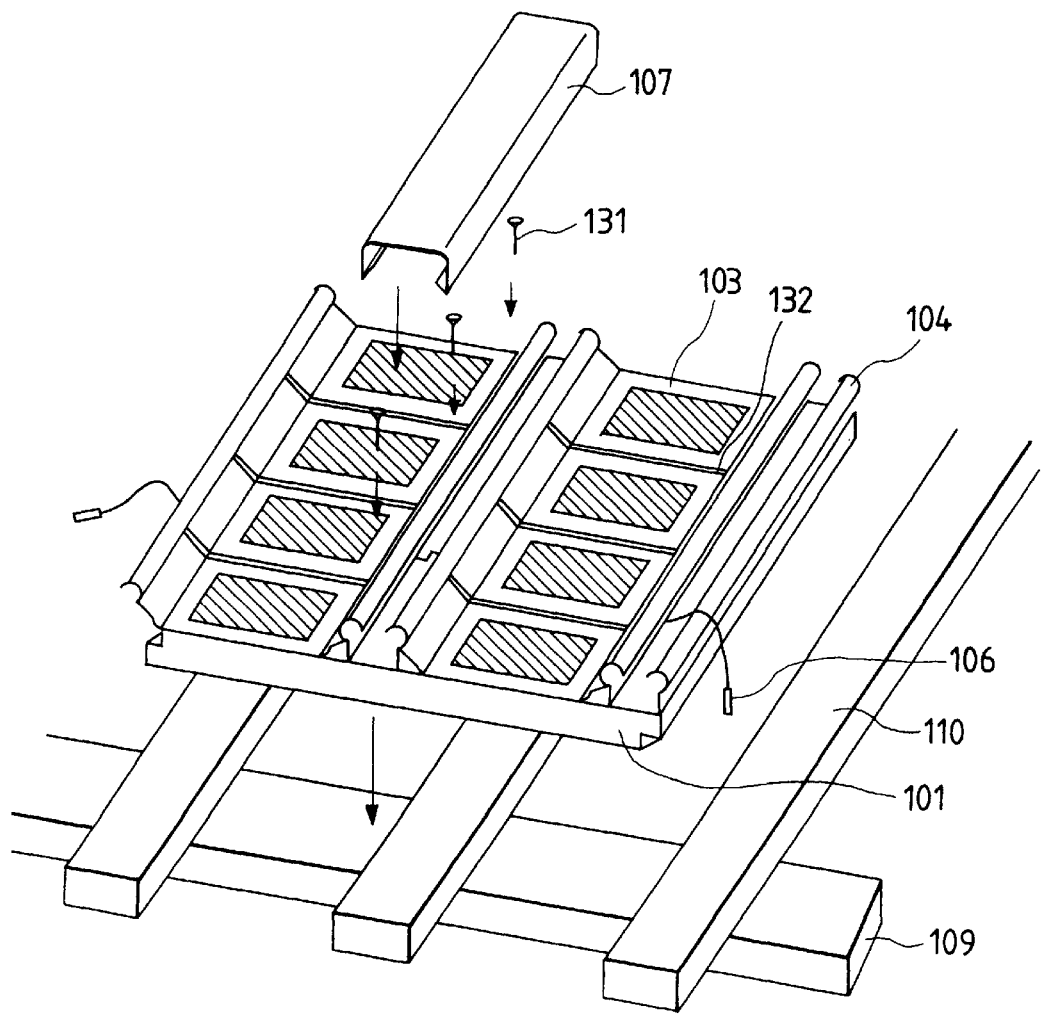
FIG. 8 is an explanatory drawing to illustrate the mounting in the third embodiment of the present invention.

The fabrication method of the combination solar battery and roof unit of the present embodiment will be described referring to FIG. 8 and FIG. 9. The present embodiment is an example in which the present invention is applied to modified vertical roofing from the conventional batten seam roofing, and the present embodiment enhances flashing by employing the cross-sectional shape of retaining clip 104 and roof panel 103 as shown in FIG. 9. In addition, the roof panel 103 is provided with horizontal ribs 132, thereby enabling to realize enhancement of wind endurance and the appearance in the design like tile roofing. The ribs 132 may not be formed only in the horizontal direction, but may also in the vertical direction. In the present embodiment the connecting part of sheathing roof board 101 is provided with a tenon for coupling, which increases the connecting force between sheathing roof boards 105 and which facilitates installation of unit.

In FIG. 9, each connector is drawn out from the junction box 121 on the bottom of roof panel 103, is guided through a through hole 133 of retaining clip 104, and is connected with another connector of adjacent roof panel 103 in the clearance between the roof panels. Reference numeral 111 designates a screw for fixing the retaining clip 104 to the sheathing roof board 101. Numeral 112 denotes an opening portion for a drill screw to pass in fixing the unit to the rafter. When the unit is mounted, the drill screw serves as a cap to again effect flashing of the opening portion. Since the roof panel 103 of the present embodiment is joined to the retaining clip 104 preliminarily screwed to the sheathing roof board 101 with a single motion, there is an effect of increasing the productivity of assembly unit.

Embodiment 4

Figure 10:
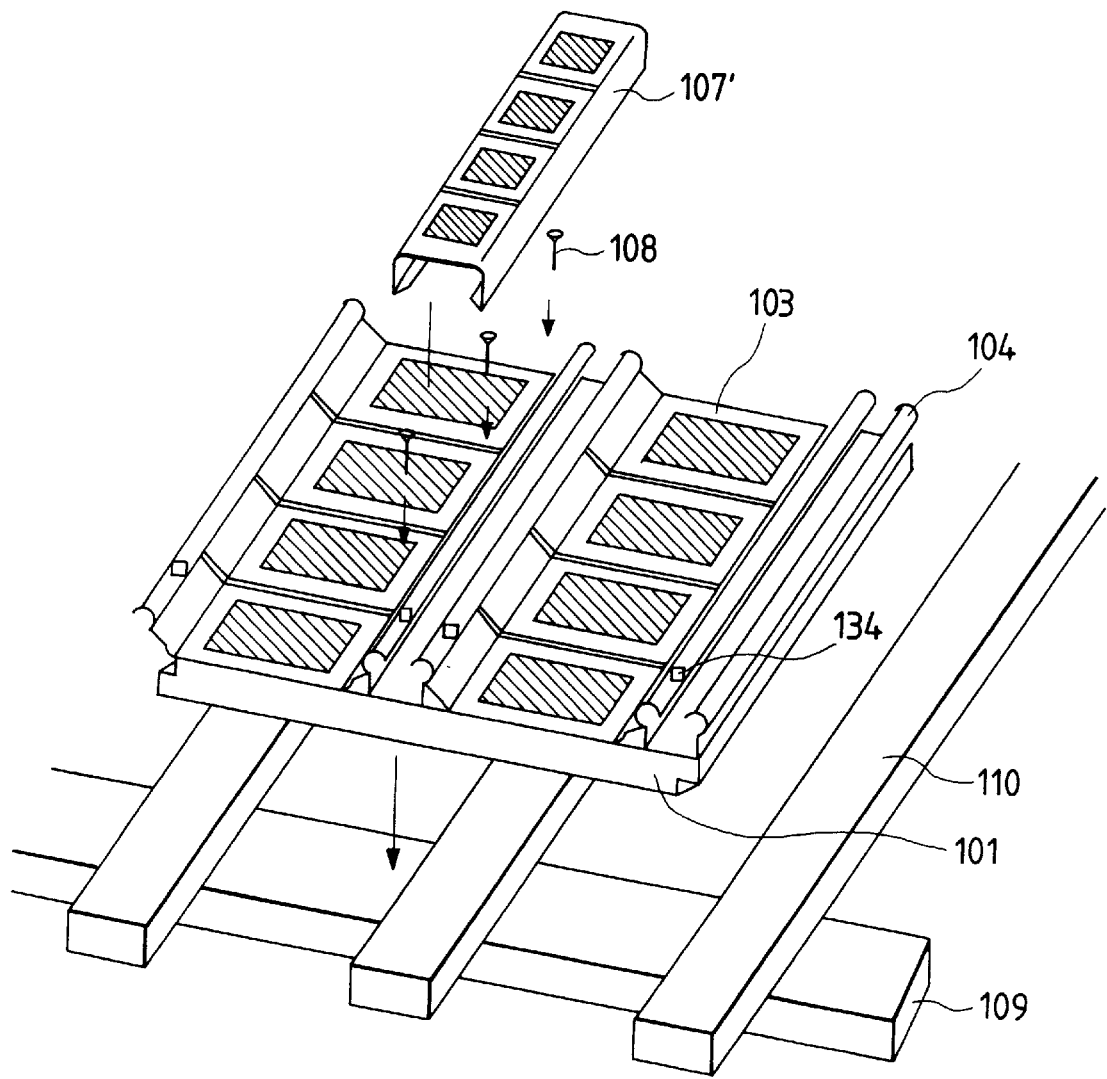
FIG. 10 is an explanatory drawing to illustrate the mounting in the fourth embodiment of the present invention.

FIG. 10 and FIG. 11 show a modification of Embodiment 3, which uses combination solar battery and caps 107' in addition. In a combination solar battery and cap 107' solar battery elements 135 are placed in the top surface and electric contacts 134 in the bottom surface. In correspondence thereto, the roof panels 103 also have electric contacts 134. Since electric connection is completed by snapping the cap 107' onto the roof panels, the present embodiment has a merit of greatly simplifying the wiring work and realizes a deeper design to make the appearance of design or the like look like a corrugated sheet.

By also providing the cap 107' with solar batteries, the light receiving area of solar batteries can be increased and there is thus an effect of increasing the quantity of power generation of roof. In addition, a design of expanding the width of through retaining clip 104 can be realized without decrease in the quantity of power generation, which improves the workability during fixing of the unit to the roof.

What is claimed is:

1. A roof-mountable assembly unit comprising a plurality of combination solar battery and roof panels, each having flanges at two opposite sides, placed adjacent to each other on a joining/fixing member in such a manner so as to form a clearance between each combination solar battery and roof panel and an adjacent combination solar battery and roof panel, wherein the adjacent combination solar battery and roof panels are fixed to said joining/fixing member in said clearance by removable fixing means, and wherein a removable cap is placed in an upper part of said clearance.

2. The roof-mountable assembly unit according to claim 1, wherein a junction box for drawing an output of said solar battery to the outside is provided in said flange and wherein wiring members connected to the junction boxes of said combination solar battery and roof panels adjacent to each other are connected in said clearance.

3. The roof-mountable assembly unit according to claim 1, wherein said joining/fixing member is of a rod shape along said clearance.

4. The roof-mountable assembly unit according to claim 3, further comprising a sheathing roof board fixed to a bottom surface of said joining/fixing member.

5. The roof-mountable assembly unit according to claim 1, wherein said joining/fixing member is a sheathing roof board of a flat plate shape.

6. The roof-mountable assembly unit according to claim 5, further comprising a rafter fixed to a bottom surface of said sheathing roof board.

7. The roof-mountable assembly unit according to claim 6, further comprising a purlin fixed to a bottom surface of said rafter.

8. The roof-mountable assembly unit according to claim 4, further comprising a rafter fixed to a bottom surface of said sheathing board.

9. The roof-mountable assembly unit according to claim 8, further comprising a purlin fixed to a bottom surface of said rafter.

10. The roof-mountable assembly unit according to claim 1, comprising a solar battery in a surface of said cap.

11. The roof-mountable assembly unit according to claim 1, wherein electric connection between said combination solar battery and roof panels adjacent to each other is effected by said cap.

12. The roof-mountable assembly unit according to claim 1, wherein said combination solar battery and roof panel is constructed in such an arrangement that a solar battery element is sealed on a backing with a filling material and that a protecting film is provided on a surface thereof.

13. The roof-mountable assembly unit according to claim 1, wherein a removable deformation preventing member is fixed in a direction perpendicular to said flanges.

14. The roof-mountable assembly unit according to claim 1, wherein in said combination solar battery and roof panel a rib is formed in a direction perpendicular to said flanges.

15. The roof-mountable assembly unit according to claim 1, wherein a horizontal beam is provided on a back surface of said combination solar battery and roof panel.

16. A roof-mountable assembly unit mounting method comprising the steps of:

mounting on a roof structural member a roof-mountable assembly unit comprising a plurality of combination solar battery and roof panels, each having flanges at two opposite sides, placed adjacent to each other on a joining/fixing member in such a manner so as to form a clearance between each combination solar battery and roof panel and an adjacent combination solar battery and roof panels wherein the adjacent combination solar battery and roof panels are fixed to said joining/fixing member in said clearance by removable fixing means;

fixing said joining/fixing member to said roof structural member in said clearance; and placing a removable cap in an upper part of said clearance.

17. The roof-mountable assembly unit mounting method according to claim 16 further comprising the steps of:

preparing a plurality of said roof-mountable assembly units;

fixing said roof-mountable assembly units to each other by fixing means; and electrically connecting said roof-mountable assembly units with each other in the clearance.

18. The roof-mountable assembly unit mounting method according to claim 16, further comprising a step of:

connecting wire members provided in junction boxes, which are provided in said flange of each of said combination solar battery and roof panels adjacent to each other and which draw an output of said solar battery to the outside, in said clearance.

19. A roof-mountable assembly unit carrying method comprising the steps of:

mounting on a roof structural member a roof-mountable assembly unit comprising a plurality of combination solar battery and roof panels, each having flanges at two opposite sides, placed adjacent to each other on a joining/fixing member in such a manner so as to form a clearance between each combination solar battery and roof panel and an adjacent combination solar battery and roof panel, wherein the adjacent combination solar battery and roof panels are fixed to said joining/fixing member in said clearance by removable fixing means;

fixing said joining/fixing member to said roof structural member in said clearance;

placing a removable cap in an upper part of said clearance; and securing a removable deformation preventing member to said roof-mountable assembly unit in a direction perpendicular to said flanges during carriage of said roof-mountable assembly units.

20. A roof-mountable assembly unit fabrication process comprising the steps of:

placing a plurality of combination solar battery and roof panels, each having flanges at two opposite sides, adjacent to each other on a joining/fixing member in such a manner so as to form a clearance between each combination solar battery and roof panel and an adjacent combination solar battery and roof panel;

fixing the adjacent combination solar battery and roof panels to said joining/fixing member in said clearance by removable fixing means; and placing a removable cap in an upper part of said clearance.

21. An air circulation system comprising a roof-mountable assembly unit comprising a plurality of combination solar battery and roof panels, each having flanges at two opposite sides, placed adjacent to each other with clearance on a joining/fixing member of a rod shapes wherein the adjacent combination solar battery and roof panels are fixed to said joining/fixing member in said clearance by removable fixing means, said air circulation system being arranged in such a manner that said roof-mountable assembly unit is mounted on a sheathing roof board, said joining/fixing member is fixed to said roof structural member in said clearance, thereby forming a space between said combination solar battery and roof panels and said roof structural member, external air is introduced into said space, and the air introduced into the space is guided into a house or is discharged to the outside of the house.

22. The air circulation system according to claim 21, wherein said air is circulated by a fan.

23. A solar electric power generation system comprising:

a roof-mountable assembly unit comprising a plurality of combination solar battery and roof panels, each having flanges at two opposite sides, placed adjacent to each other with clearance on a joining/fixing member, the adjacent combination solar battery and roof panels are fixed to said joining/fixing member in said clearance by removable fixing means, a removable cap placed in an upper part of said clearance, a junction box for drawing output of said solar battery to the outside provided in each said flange, and wire members connected to the junction boxes of said combination solar battery and roof panels adjacent to each other connected to each other in said clearance; and a power converting device electrically connected to said solar batteries.

24. A solar battery module mounting method comprising the steps of:

preparing a plurality of solar battery strings, each being formed by connecting a plurality of solar battery modules in series;

guiding outputs of said plurality of solar battery strings to a DC combiner box independently of each other; and connecting the outputs of said plurality of solar battery strings in parallel inside said DC combiner box.

25. The solar battery module mounting method according to claim 24, wherein an output voltage of each solar battery string is equal to an input voltage of an inverter.

26. The solar battery module mounting method according to claim 24, wherein each solar battery string has a breaker before a point of parallel connection.

27. A roof-mountable assembly unit comprising a plurality of combination solar battery and roof panels, each having flanges at two opposite sides, placed adjacent to each other on a joining/fixing member, wherein the adjacent combination solar battery and roof panels are fixed to said joining/fixing member, and wherein each of said plurality of combination solar battery and roof panels has a wiring member for introducing an output of said solar battery outside of said combination solar battery and roof panel, the wiring members of said combination solar battery and roof panels adjacent each other being electrically connected to each other.

28. A roof-mountable assembly unit according to claim 27, wherein said plurality of combination solar battery and roof panels are arranged adjacent to each other with a clearance on said joining/fixing member and the wiring members are electrically connected to each other in said clearance.

29. A roof-mountable assembly unit according to claim 27, wherein said plurality of combination solar battery and roof panels are fixed to said joining/fixing member with respect to each other in said clearance by removable fixing means and a removable cap is provided on an upper portion of said clearance.

30. A roof-mountable assembly unit mounting method comprising the steps of:

mounting on a roof structural member a roof-mountable assembly unit in which a plurality of combination solar battery and roof panels, each having flanges at two opposite sides, are placed adjacent to each other on a joining/fixing member, the adjacent combination solar battery and roof panels are fixed to said joining/fixing member, and each of said plurality of combination solar battery and roof panels has a wiring member for introducing an output of said solar battery outside of said combination solar battery and roof panel, the wiring members of said combination solar battery and roof panels adjacent each other being electrically connected to each other;

fixing said joining/fixing member to said roof structural member; and electrically connecting said plurality of said combination solar battery and roof panels with each other.

31. The roof-mountable assembly unit mounting method according to claim 30, wherein said plurality of combination solar battery and roof panels are arranged adjacent to each other with a clearance on said joining/fixing member and the wiring members are electrically connected to each other in said clearance.

32. The roof-mountable assembly unit mounting method according to claim 31, wherein said joining/fixing member is fixed to said roof structural member by removable fixing means in said clearance.

33. The roof-mountable assembly unit mounting method according to claim 31, further comprising a step of:

placing a removable cap in an upper portion of said clearance.

34. A roof-mountable assembly unit fabricating process comprising the steps of:

placing a plurality of combination solar battery and roof panels, each having flanges at two opposite sides, adjacent to each other on a joining/fixing member;

fixing the adjacent combination solar battery and roof panels to said joining/fixing member; and providing on each of said plurality of combination solar battery and roof panels a wiring member for introducing an output of said solar battery outside of said combination solar battery and roof panel, the wiring members of said combination solar battery and roof panels adjacent each other being electrically connected to each other.

35. The roof-mountable assembly unit fabricating process according to claim 34, wherein said plurality of combination solar battery and roof panels are arranged adjacent to each other with a clearance on said joining/fixing member and the wiring members are electrically connected to each other in said clearance.

36. The roof-mountable assembly unit fabricating process according to claim 35, wherein said joining/fixing member is fixed by removable fixing means to said roof structural member in said clearance.

37. The roof-mountable assembly unit fabricating process according to claim 35 further comprising a step of:

placing a removable cap in an upper portion of said clearance.

* * * * *

UNITED STATES PATENT AND TRADEMARK OFFICE
CERTIFICATE OF CORRECTION

PATENT NO. : 6,182,403 B1
DATED : February 6, 2001
INVENTOR(S) : Toshihiko Mimura et al.

It is certified that error appears in the above-identified patent and that said Letters Patent is hereby corrected as shown below:

<u>Title page,</u>
Item [56], References Cited, under FOREIGN PATENT DOCUMENTS:
"05055618" should read -- 5-55618 --;
"07211932" should read -- 7-211932 --; and
"07302924" should read -- 7-302924 --.

<u>Column 1,</u>
Line 53, "not" should read -- (not --; and
Line 54, "illustrated." should read -- illustrated) --.

<u>Column 2,</u>
Lines 15 and 20, "not illustrated" should read -- (not illustrated) --; and
Line 16, "not illustrated." should read -- (not illustrated) --.

<u>Column 3,</u>
Lines 1 and 24, "mounted," should read -- being mounted, --.

<u>Column 5,</u>
Line 21, "Jig" should read -- jig --.

<u>Column 8,</u>
Line 44, "as" should be deleted; and
Line 60, "line of" should read -- line --.

<u>Column 10,</u>
Line 2, "the" should be deleted;
Line 18, "easy" should read -- which make it easy --; and
Line 46, "as" should be deleted.

UNITED STATES PATENT AND TRADEMARK OFFICE
CERTIFICATE OF CORRECTION

PATENT NO. : 6,182,403 B1
DATED : February 6, 2001
INVENTOR(S) : Toshihiko Mimura et al.

It is certified that error appears in the above-identified patent and that said Letters Patent is hereby corrected as shown below:

Column 14,
Line 33, "panels" should read -- panel, --.

Column 15,
Line 27, "shapes" should read -- shape, --.

Signed and Sealed this

Sixth Day of August, 2002

*Attest:*

JAMES E. ROGAN
*Attesting Officer*  *Director of the United States Patent and Trademark Office*